United States Patent [19]
Starr et al.

[11] Patent Number: 6,085,033
[45] Date of Patent: Jul. 4, 2000

[54] METHOD FOR DETERMINING BIT ELEMENT VALUES FOR DRIVER IMPEDANCE CONTROL

[75] Inventors: Jonathan E. Starr, Cupertino; Sai V. Vishwanthaiah, Sunnyvale; Alexander D. Taylor, Cupertino, all of Calif.

[73] Assignee: Sun Microsystems, Inc., Palo Alto, Calif.

[21] Appl. No.: 08/881,938

[22] Filed: Jun. 25, 1997

[51] Int. Cl.$^7$ ..................................................... G06F 17/50
[52] U.S. Cl. .............................. 395/500.15; 395/500.02
[58] Field of Search .................................. 364/488, 489, 364/490, 491, 578; 395/500.15, 500.02

[56] References Cited

U.S. PATENT DOCUMENTS

| | | | |
|---|---|---|---|
| 4,694,205 | 9/1987 | Shu et al. | 327/530 |
| 4,719,369 | 1/1988 | Asano et al. | 307/443 |
| 4,743,784 | 5/1988 | Obara et al. | 307/530 |
| 4,804,871 | 2/1989 | Walters, Jr. | 807/530 |
| 4,831,287 | 5/1989 | Golab | 307/530 |
| 4,845,675 | 7/1989 | Krenik et al. | 365/203 |
| 4,855,628 | 8/1989 | Jun | 307/530 |
| 4,859,877 | 8/1989 | Cooperman et al. | 307/448 |
| 4,931,675 | 6/1990 | Iwata | 327/550 |
| 4,937,479 | 6/1990 | Hoshi | 327/550 |
| 4,959,563 | 9/1990 | Schenck | 307/448 |
| 5,194,765 | 3/1993 | Dunlop et al. | 307/443 |
| 5,299,137 | 3/1994 | Kingsley | 364/489 |
| 5,337,254 | 8/1994 | Knee et al. | 364/489 |
| 5,371,420 | 12/1994 | Nakao | 326/27 |
| 5,457,407 | 10/1995 | Shu et al. | 326/30 |
| 5,615,161 | 3/1997 | Mu | 365/208 |
| 5,644,252 | 7/1997 | Watarai | 326/27 |
| 5,666,078 | 9/1997 | Lamphier et al. | 327/108 |
| 5,852,579 | 12/1998 | Arcoleo et al. | 365/189.05 |

FOREIGN PATENT DOCUMENTS

| 4-178995 | 6/1992 | Japan | 327/52 |
|---|---|---|---|

OTHER PUBLICATIONS

Kevin S. Donnelly et al.; "A 660 MB/s Interface Megacell Portable Circuit in 0.3 $\mu$m–.07 $\mu$m CMOS ASIC", IEEE Journal of Solid State Circuits, vol. 31, No. 12, Dec. 1996.

Toshiro Takahashi et al.; "A CMOS Gate Array with 600Mb/s Simultaneous Bidirectional I/O Circuits", Article from IEEE International Solid–State Circuits Conference, pp. 40–41, 1995.

*Primary Examiner*—Kevin J. Teska
*Assistant Examiner*—Leigh Marie Garbowski
*Attorney, Agent, or Firm*—Skjerven, Morrill, MacPherson, Franklin & Friel LLP; Stephen A. Terrile

[57] ABSTRACT

A method for determining bit element values for an impedance control circuit is provided which controls the output impedance of drivers which are coupled to the impedance control circuit. Accordingly, a desired driver output impedance can advantageously be established and maintained over a wide range of variations in operating conditions and manufacturing processes. Thereby shortening the signal settling time and increasing the attainable signaling frequency.

13 Claims, 6 Drawing Sheets

METHOD FOR DETERMINING BIT ELEMENT VALUES FOR DRIVER IMPEDANCE CONTROL

CROSS-REFERENCE TO RELATED APPLICATIONS

This application relates to co-pending U.S. patent application Ser. No. 08/881,925, filed on even date herewith, entitled Broadly Distributed Termination For Buses Using Switched Terminator Logic and naming Jonathan E. Starr as inventor, the application being incorporated herein by reference in its entirety.

This application relates to co-pending U.S. patent application Ser. No. 08/887,187, filed on even date herewith, entitled Differential Receiver and naming Michael A. Ang, Alexander D. Taylor, and Jonathan E. Starr as inventors, the application being incorporated herein by reference in its entirety.

This application relates to co-pending U.S. patent application Ser. No. 08/881,926, filed on even date herewith, entitled Method for Resolving Differential Signals and naming Michael A. Ang, Alexander D. Taylor and Jonathan E. Starr as inventors, the application being incorporated herein by reference in its entirety.

This application relates to co-pending U.S. patent application Ser. No. 08/881,939, filed on even date herewith, entitled Impedance Control Circuit and naming Sai V. Vishwanthaiah, Alexander D. Taylor and Jonathan E. Starr as inventors, the application being incorporated herein by reference in its entirety.

This application relates to co-pending U.S. patent application Ser. No. 08/881,940, filed on even date herewith, entitled Method for Controlling the Impedance of a Driver Circuit and naming Sai V. Vishwanthaiah, Alexander D. Taylor and Jonathan E. Starr as inventors, the application being incorporated herein by reference in its entirety.

This application relates to co-pending U.S. patent application Ser. No. 08/881,927, filed on even date herewith, entitled Method of Broadly Distributing Termination for Buses Using Switched Terminators and naming Jonathan E. Starr as inventor, the application being incorporated herein by reference in its entirety.

BACKGROUND OF THE INVENTION

1. Field of the Invention

The present invention relates to driver circuits and more particularly to controlling the output impedance of driver circuits.

2. Description of the Related Art

In computer and information processing systems, various integrated circuit chips must communicate digitally with each other over common buses. The signal frequency at which this communication occurs can limit the performance of the overall system. Thus the higher the communication frequency, the better. The maximum frequency at which a system communicates is a function not only of the time that it takes for the electromagnetic wavefronts to propagate on the bus from one chip to another, but also of the time required for the signals to settle to levels that can be reliably recognized at the receiving bus nodes as being high or low, referred to as the settling time.

There are several factors which affect the settling time of a signal. For example, ringing due to reflections from impedance mismatches within the bus system is a factor which affects the settling time of the signal. The voltage level of the launched signal relative to the overall signal swing is another factor which affects the settling time of the signal. The effectiveness of the termination of the bus is another factor which affects the settling time of the signal. Ringing, the relative voltage level and termination of the bus are controllable by controlling the output impedance of the driver. However, controlling the output impedance of an output driver can be challenging.

More specifically, because drivers are typically constructed with transistors, and often CMOS transistors, the operating characteristics of the transistors affect the output impedance of the driver. The operating characteristics of transistors can change under a variety of circumstances. For example, these operating characteristics change with variations in operating conditions such as junction temperature and supply voltage levels. The operating characteristics may also change with variations in manufacturing process.

If inadequate compensation is made for these variations, the output impedance of the driver may vary substantially within a particular chip from time to time as well as from chip to chip.

SUMMARY OF THE INVENTION

It has been discovered that an impedance control circuit may be provided which controls the output impedance of drivers which are coupled to the impedance control circuit. Accordingly, a desired driver output impedance can advantageously be established and maintained over a wide range of variations in operating conditions and manufacturing processes, thereby shortening the signal settling time and increasing the attainable signaling frequency.

In a preferred embodiment, the invention relates to a method for determining bit element values of a base bit element and a plurality of controllable bit elements having an impedance range from a lowest impedance to a highest impedance based upon bit element characteristics, the base bit element and the plurality of controllable bit elements being within an impedance control circuit. The method includes the steps of determining a desired stepped impedance value for providing a desired impedance resolution; determining a value of a width of base bit element functioning alone when the base bit element is functioning at the lowest impedance; determining the value of a total width of a plurality of bit elements functioning together when the bit elements are functioning at the highest impedance; subtracting the value of the width of the base bit element from the total width to provide a sum width; determining a number of controllable bit elements required to provide the stepped impedance range based upon the width of base bit element, the sum width and the size of the desired stepped impedance within the impedance range.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates similar or identical items.

DETAILED DESCRIPTION

Figure 1:
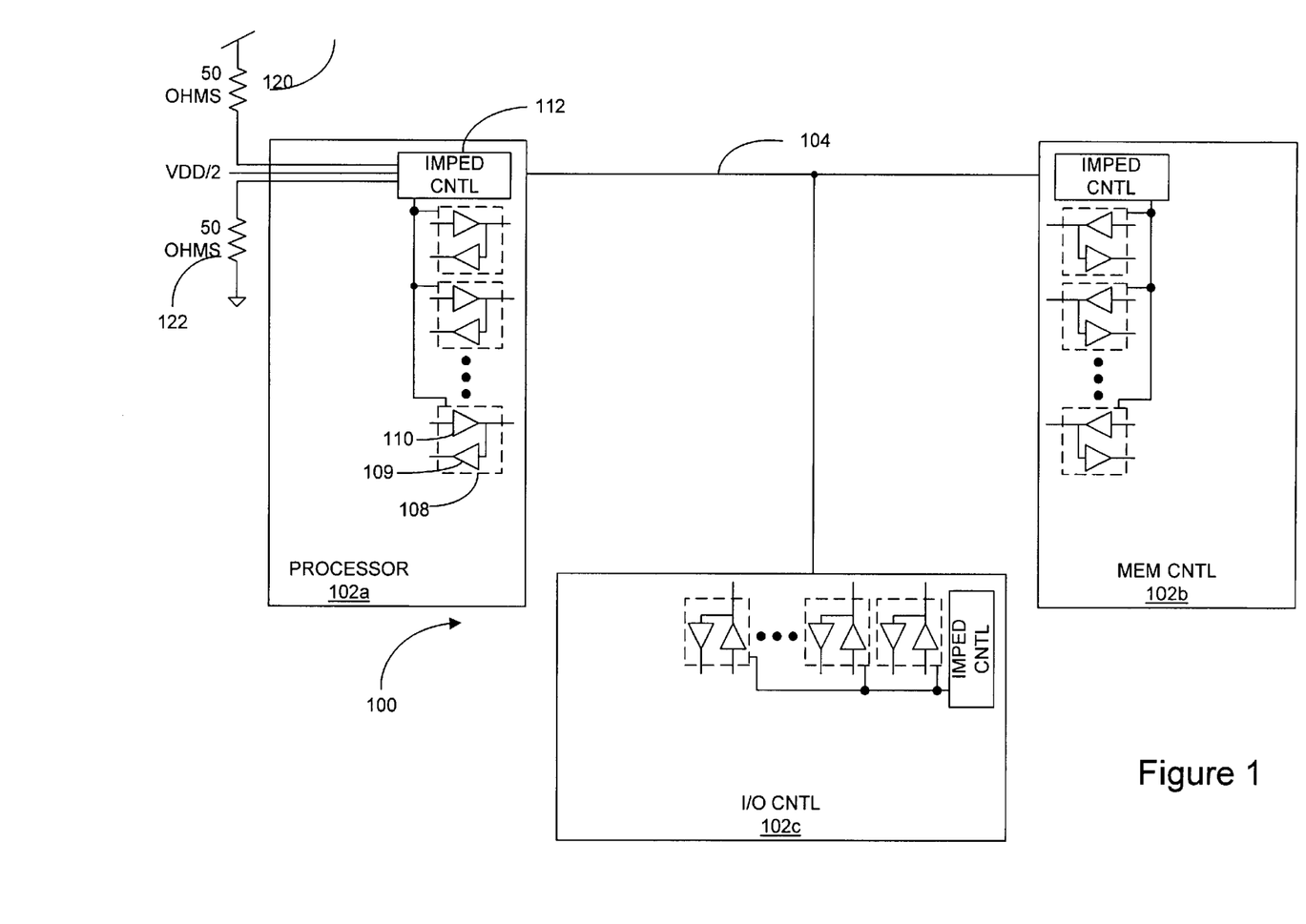
FIG. 1 shows a block diagram of an information handling system having an impedance control circuit in accordance with the present invention.

Referring to FIG. 1, information handling system 100 includes a plurality of components 102 such as processor 102a, memory controller 102b, and I/O controller 102c. It will be appreciated that these components 102 may be any type of component commonly found in an information handling system. Each of these components 102 is generally configured as an individual integrated circuit chip. However, it is known to combine various components into a single integrated circuit chip. Components 102 are coupled via bus 104. Bus 104 includes a plurality of parallel lines which are coupled to individual signal outputs of each of the components 102.

Each component 102 includes a plurality of input/output circuits 108 which are coupled to individual signal paths of bus 104. Each input/output circuit 108 includes a receiver circuit 109 and a driver circuit 110.

Component 102 also includes impedance control circuit 112 which is coupled to each driver circuit 110. Impedance control circuit 112 controls driver circuits 110 so that the impedance of each driver is matched to that of a desired value of resistance, e.g., the characteristic impedance of the transmission line of the bus 104. Impedance control circuit 112 is coupled to VDDO via resistor 120 and to ground via resistor 122. Resistor 120 and resistor 122 are external of component 102. The resistance values of resistor 120 and resistor 122 are chosen to match the desired value of resistance. E.g., in a preferred embodiment, resistor 120 and resistor 122 each have a resistance value of 50 ohms (since 50 ohms is commonly the characteristic impedance of a transmission line). Impedance control circuit 112 also receives the input voltage In operation, driver circuits 110 are controlled by impedance control circuit 112 to establish and maintain a desired output impedance over a wide range of variations in operating conditions and manufacturing processes. Impedance control circuit 112 provides an impedance control signal to each driver circuit 110 which signal controls the output impedance of the driver circuits. The impedance control signal includes a pull up impedance control signal and a pull down impedance control signal.

Figure 2:
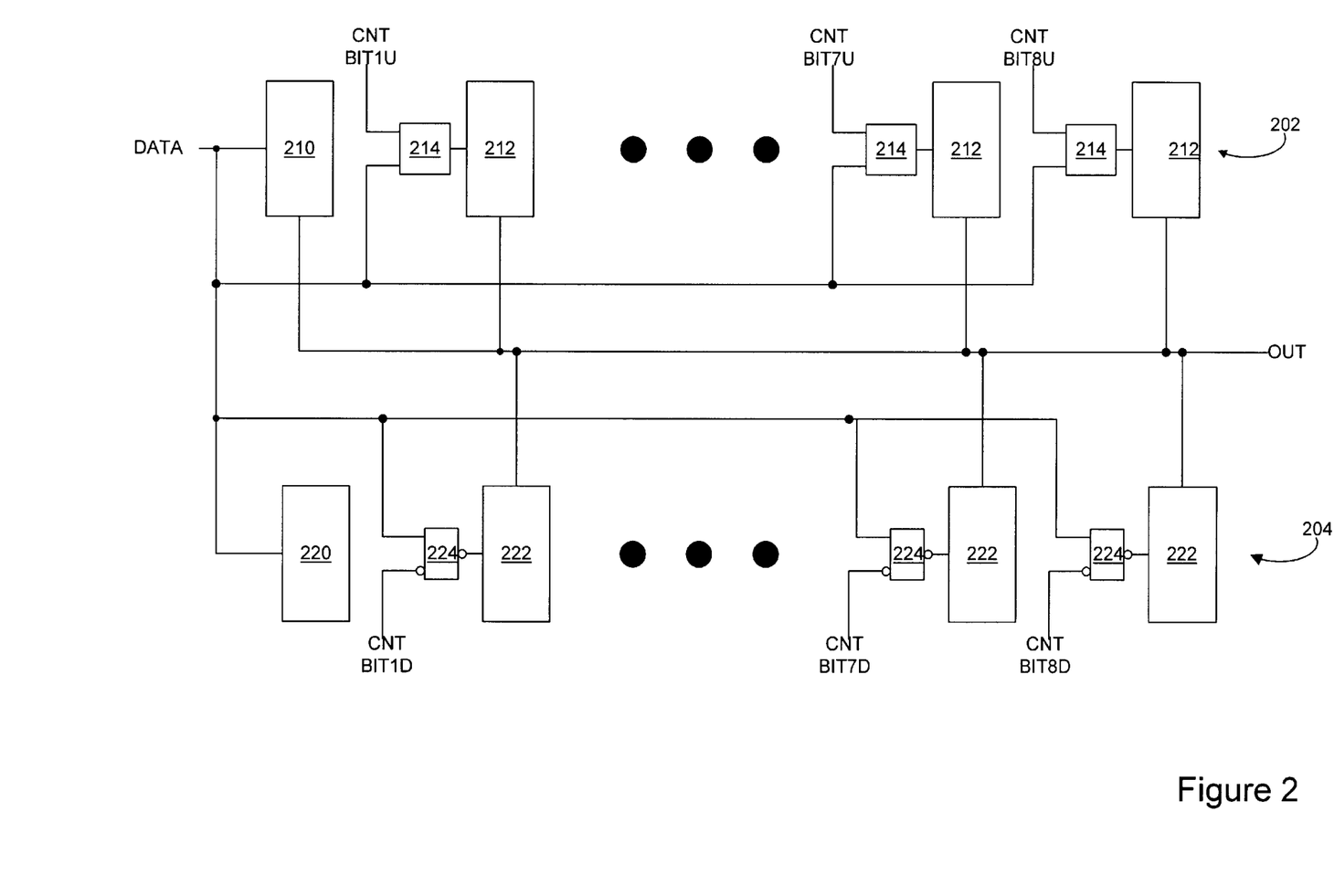
FIG. 2 shows a block diagram of an exemplative driver circuit of the information handling system of FIG. 1.

Referring to FIG. 2, exemplative driver circuit 110 includes pull up circuit 202 and pull down circuit 204. Pull up circuit 202 includes base bit element 210 as well as a plurality of controllable pull up bit elements 212. Each controllable pull up bit element is controlled by logic 214 which receives a bit of the pull up bit control signal (CNT BIT 1U–CNT BIT 8U). Pull down circuit 204 includes base bit element 220 as well as a plurality of controllable pull down bit elements 222. Each pull down bit element is controlled by respective logic 224 which receives a bit of the pull down bit control signal (CNT BIT 1D–CNT BIT 8D). The combination of the pull up bit control signal and the pull down bit control signal provides the impedance control signal.

It will be appreciated that other driver circuits 110 may be controlled with impedance control circuit 112. A common feature of the driver circuits is a plurality of bit elements at least some of which are controllable, and more specifically, a base bit element and a plurality of additional controllable controllable bit elements.

Figure 3:
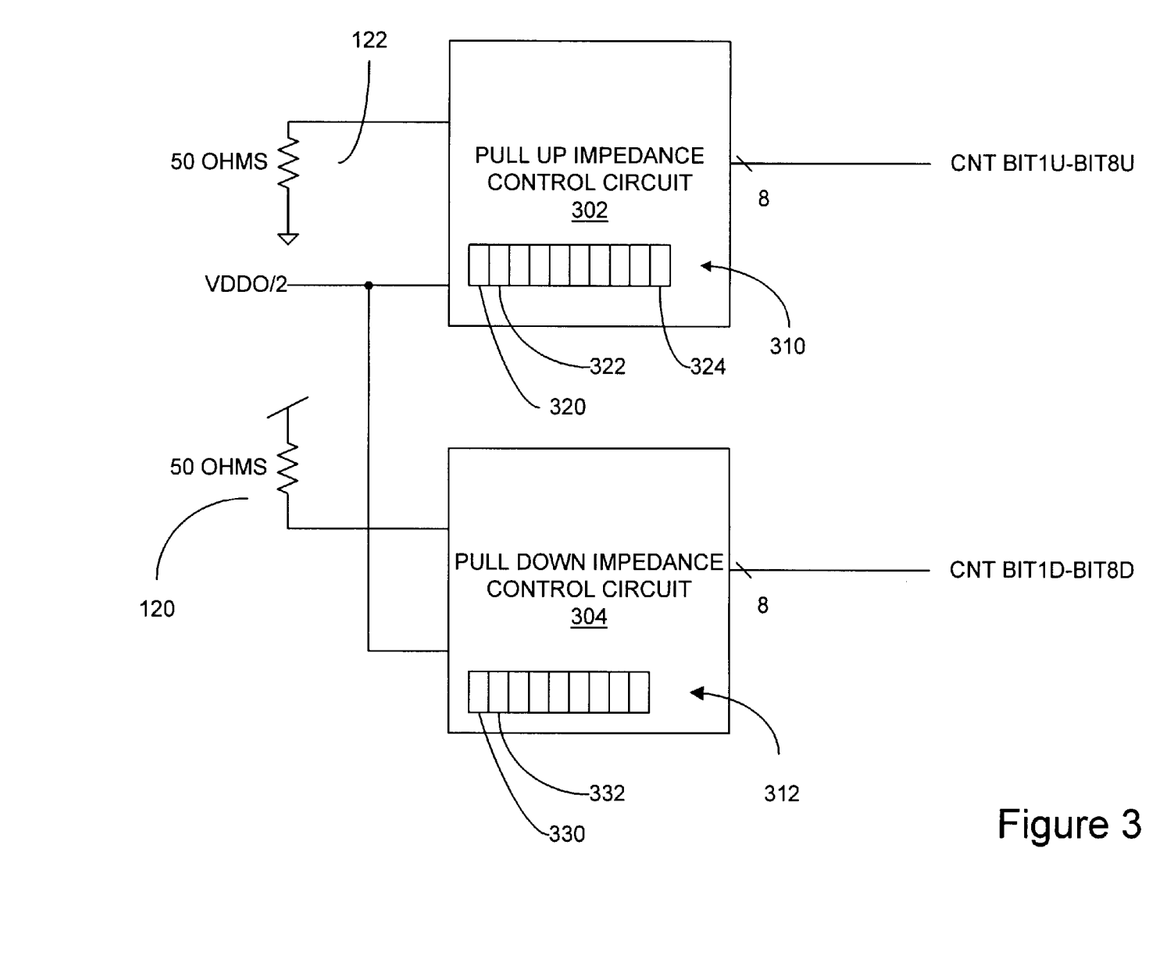
FIG. 3 shows a block diagram of an impedance control circuit of the FIG. 1 information handling system.

Referring to FIG. 3, impedance control circuit 112 includes a pull up impedance control circuit 302 and a pull down impedance control circuit 304. Pull up impedance control circuit 302 receives the voltage VDDO/2 as well as the output of a 50 ohm precision resistor 122 that is coupled between ground and pull up impedance control circuit 302. Pull up impedance control circuit 302 provides the 8-bit pull up control signal (CNT BIT1U–8U). Pull up impedance control circuit 302 includes a bit element circuit 310 which includes a base bit element 320 and a plurality of controllable bit elements 322 corresponding to the base bit element and the controllable bit elements of pull up driver circuit 202. Bit element circuit 310 also includes an additional impedance producing bit element 324 which functions as an additional impedance producing bit element.

Pull down impedance control circuit 304 receives the voltage VDDO/2 as well as the output of the resistor 120 that is coupled between the VDDO and pull down impedance control circuit 304. Pull down impedance control circuit 304 provides the 8-bit pull down control signal (CNT BIT 1D–8D). Pull down impedance control circuit 304 includes a bit element circuit 312 which includes a base bit element 330 and a plurality of controllable bit elements 332 corresponding to the base bit element and the controllable bit elements of pull down driver circuit 204.

It will be appreciated that any width control signal may be used for the pull up and pull down control signals. In the preferred embodiment, an 8-bit wide signal is provided because 8 bits provides a sufficient number of impedance variances without requiring an undue number of parallel traces which are provided to every driver circuit within each component 102. Pull up impedance control circuit 302 and pull down impedance control circuit 304 are also each coupled to the voltage VDDO and to ground.

Impedance control circuits 302, 304 use a thermometer coded scheme, i.e., a scheme in which no more than one bit within the bit chain changes during any given cycle. The bits within impedance matching circuits 302, 304 are enabled in order, with only one bit being enabled or disabled in any given cycle. The bit that is enabled is at the junction of the enable and disabled bits. A thermometer coded scheme has less resolution for a given number of parallel elements compared with a binary coded scheme. However, such a scheme provides the advantage of avoiding having all bit element transistors go through some transitional state whose impedance is substantially different from the desired impedance as might occur during a transition in a binary coded scheme. For example if a set of three transistors were transitioning from "011" to "100", there might be a time when all of the transistors were off. Such a transitional state can produce undesirable signals on the transmission line.

In addition to the thermometer coded scheme, the resistance values of the bit elements are chosen such that the enabling of each bit increases the net channel width of the parallel combination of transistors by a fixed percentage. This reduces the net resistance of the parallel combination by nearly the same fixed percentage.

The bit elements are sized so that enabling only the base bit element provides an impedance substantially near 50 ohms, e.g., 49 ohms, in the fastest corner (i.e., lowest impedance corner) of the PVT variations. Additionally, the bit elements are sized so that enabling all of the elements within the bit element circuit provides an impedance substantially near 50 ohms in the slowest corner (i.e., highest impedance corner) of the PVT variations.

For example, if operating conditions are such that the impedance of the base bit alone is 60.0 ohms, impedance control circuit 304 recognizes that this resistance is higher than 50 ohms and causes the first of the eight additional bit elements to be enabled in parallel with the base bit element. This bit element reduces the net resistance of the parallel combination by ,e.g., about 7 percent, to a net resistance of 55.8 ohms. However, this resistance is still higher than 50 ohms, so impedance control circuit 304 recognizes that this resistance is still higher than 50 ohms and causes a second controllable bit element to be enabled, thereby reducing the net resistance by 7 percent to 51.9 ohms. Again, this resistance is still higher than 50 ohms, and so a third controllable bit element is enabled, thereby reducing the net resistance by 7 percent to 48.3 ohms.

When the 50 ohm goal is straddled by the configuration with two additional bit transistors enabled and the configuration with three bit transistors enabled, impedance control circuit 304 provides the impedance control signal indicating which bit elements of the driver circuit to enable.

For pull down impedance control circuit 304, the control signal controls the pull down bit elements so that the lower resistance value is selected. I.e., to attain the finest granularity in the effect of each bit while covering the range of operating conditions between the fastest PVT corner and the slowest PVT corner, the pull down bit elements are sized so that the net resistance is slightly less than 50 ohms when all bit transistors are enabled in the slowest PVT corner and when only the base bit transistor is enabled in the fastest PVT corner.

Alternately, for pull up impedance control circuit 302, control signal controls the pull up bit elements so that the higher resistance value is selected. I.e., to attain the finest granularity in the effect of each bit while covering the range of operating conditions between the fastest PVT corner and the slowest PVT corner, the pull up bit elements are sized so that the net resistance is slightly more than 50 ohms when all bit transistors are enabled in the slowest PVT corner and when only the base bit transistor is enabled in the fastest PVT corner.

By selecting the lower resistance value for the pull down driver circuit and the higher resistance value for the pull up driver circuit, the swing of the output signal of the driver circuit is maximized while attaining the goal of establishing and maintaining a desired output impedance.

Figure 4:
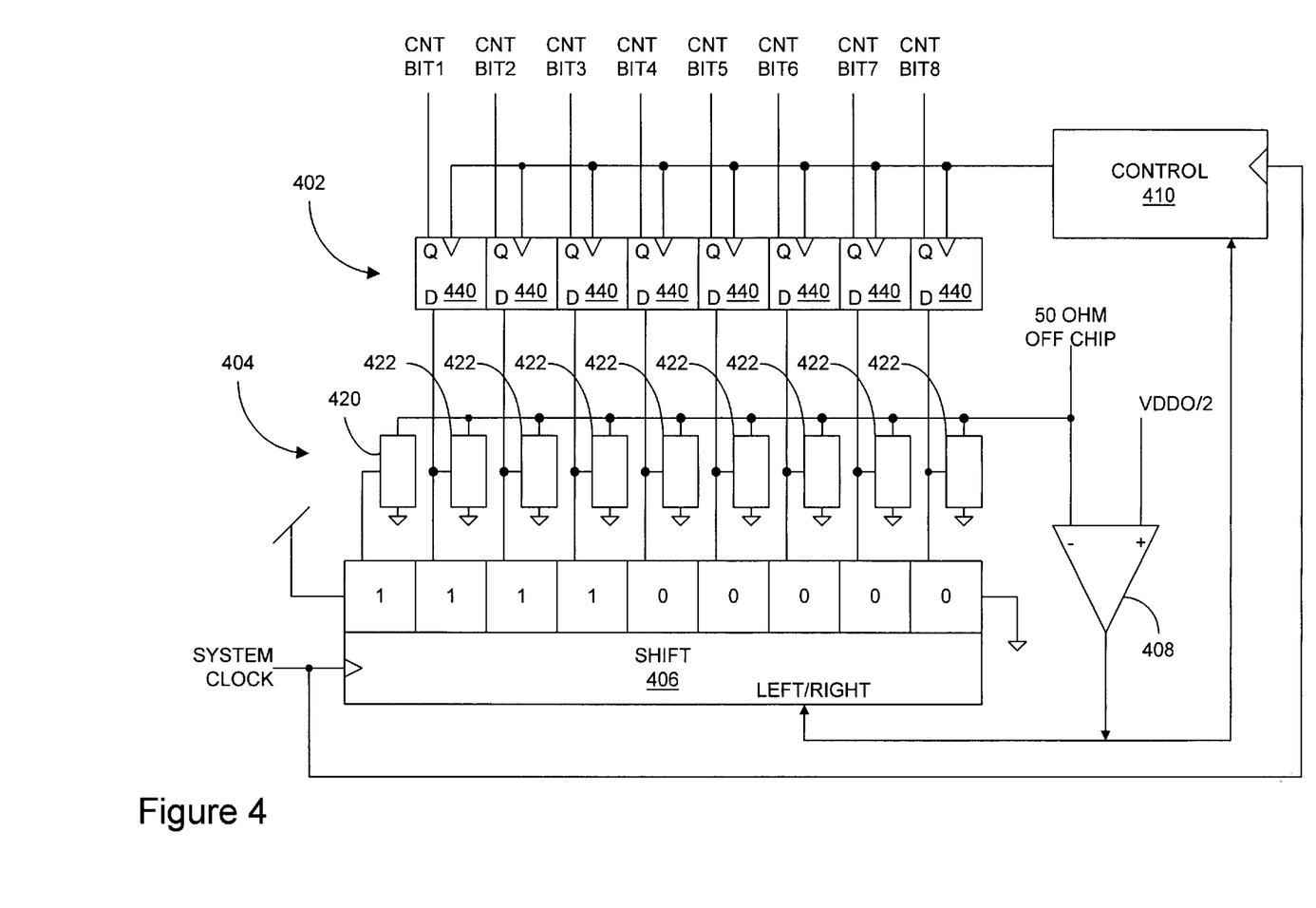
FIG. 4 shows a schematic block diagram of a pull down impedance control circuit of the impedance control circuit of FIG. 3.

Referring to FIG. 4, pull down impedance control circuit 304 includes register circuit 402, pull down bit element circuit 404, shift circuit 406, comparator 408 and control circuit 410. Pull down bit element circuit 404 is coupled between register circuit 402 and shift circuit 406. Control circuit 410 receives the output of comparator 408 as an input and provides a "clock" or latch signal to register circuit 402. Comparator 408 is coupled to the outputs of the pull down bit elements within pull down element circuit 404; comparator 408 also receives the voltage level VDDO/2 as in input. Shift circuit 406 and control circuit 410 also each receive a system clock signal.

Pull down bit element circuit 404 includes nine pull down bit elements that are coupled in parallel between the input to comparator 408 and ground. Bit element 420 functions as a base bit element and bit elements 422 function as parallel pull down bit elements. The characteristics and configurations of the bit elements are chosen to substantially mimic the characteristics of the corresponding bit elements within the pull down portion of the driver circuit.

Figure 7A:
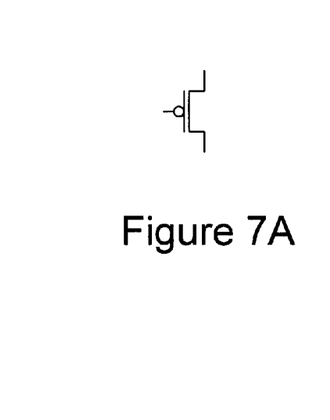
FIGS. 7A, 7B, 7C and 7D show schematic block diagrams of a variety of bit elements of the driver circuits and the impedance control circuit in accordance with the present invention.
Figure 7B:
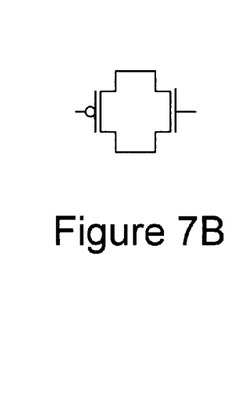
Figure 7C:
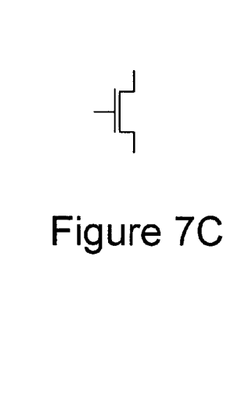

More specifically, in a preferred embodiment, each pull down element 420, 22 is an NMOS transistor as shown in FIG. 7C. Each transistor is coupled in parallel between the input to comparator 408 and ground. Transistor 420 functions as a base bit transistor and transistors 422 function as controllable bit transistors. The gate of each controllable bit transistor 422 is coupled to a bit of shift circuit 406 such that the bit controls turning the transistor on and off. The sources of each transistor 420, 422 are coupled to ground. Each transistor has substantially the same transistor characteristics as the corresponding bit element within the driver circuit. Accordingly the transistors of pull down bit element circuit 404 are coupled to mimic the transistors that function as the pull down elements of driver 110 with the exception that the base bit of driver 110 cannot be turned on or off.

Register circuit 402 includes a plurality of flip flops 440 that correspond to the controllable bit transistors 422. The input of each flip flop 440, e.g., the D input, is coupled to the gate of a respective controllable bit transistor 422 and to a bit of shift circuit 406. The clock input of each flip flop is coupled to receive the latch signal provided by control circuit 410. Each flip flop 440 provides a respective bit of the bit control signal CNT BIT 1D–8D.

In operation, shift circuit 406 receives the system clock signal as well as the output of comparator 408, which functions as a left/right shift control input. If the left/right shift control input is high, then shift circuit 406 shifts to the left on the next rising clock edge of the system clock signal. If the shift control input is low then shift circuit 406 shifts to the right on the next rising clock edge of the system clock signal.

Shift circuit 406 is initialized so that there is only one interface between bits of different values. All of the bits to the left of the interface are 1's and all of the bits to the right of the interface are 0's. The left input to shift circuit 406 is coupled high and the right input is coupled low. Therefore, when the shift circuit 406 shifts right, a 1 is shifted into the left most bit and when the shift circuit 406 shifts left, a 0 is shifted into the right most bit. Accordingly, when the interface between the bits of different values shifts position, all of the bits to the left of the interface are 1's and all those to the right of the interface are 0's.

Comparator 408 receives the VDDO/2 input as its positive input and the output of bit element circuit 404 as its negative input. If the voltage at the positive input is higher than the voltage at the negative input, the output of comparator 408 is a full rail high signal (VDDO). If the voltage at the positive input is lower than the voltage at the negative input, then the output of comparator 408 is a full rail low signal (VSSO). The comparator is sensitive enough to resolve small voltage differences between the inputs (e.g., voltage differences as low as 1.0 mV.).

Resistor 122 (see FIG. 1) and bit element circuit 404 are coupled in series between VDDO and VSSO. Therefore, the voltage at the connection of resistor 122 and bit element circuit 404, which is also coupled to the negative input of comparator 408, is determined by the voltage division between the resistance of resistor 122 and the resistance of bit element circuit 404. Therefore, if the resistance across bit element circuit 404 is higher than that of resistor 122, the voltage at the negative input of comparator 408 is greater than VDDO/2. Alternately, if the resistance across bit element circuit 404 is lower than that of resistor 122, then the voltage at the negative input of comparator 408 is lower than VDDO/2.

Accordingly, if the resistance of bit element circuit 404 is more than that of resistor 122, then comparator provides a low output signal. On the next clock edge, shift circuit 406 shifts right. This shift enables one more bit element of bit element circuit 404. Enabling one more bit element reduces the resistance of bit element circuit 404 and thereby reduces the voltage at the negative input of comparator 408.

If the resistance of bit element circuit 404 is still greater than that of resistor 122, then the voltage at the negative input of comparator 408 is still higher than VDDO/2. Therefore, the output of comparator 408 continues to be low and shift circuit 406 again shifts right on the next clock edge, thereby enabling another bit element within bit element circuit 404.

If, with the enabling of another bit element, the resistance of bit element circuit 404 becomes less than that of resistor 122, then the voltage at the negative input of comparator 408 becomes less than VDDO/2. The output of comparator 408 then goes high which causes shift circuit 406 to shift left on the next clock edge. When shift circuit shifts left, a bit element is disabled.

The disabling of the bit element causes the resistance of circuit 404 to again become higher than that of resistor 122. Therefore the negative input to comparator 408 goes above VDDO/2 and the output of comparator 408 goes low. Shift circuit 406 thus shifts right, enabling the appropriate bit element.

Accordingly, bit element circuit 404, comparator 408 and shift circuit 406 provide a feedback loop which eventually reaches a point at which the enabling of a bit element causes the resistance of circuit 404 to go below that of resistor 122 and the disabling of the bit element causes the resistance to be above that of resistor 122. When this situation occurs, the voltage at the negative input of comparator 408 toggles on each clock cycle from being above VDDO/2 to being below it, or vice versa. Therefore, the output of comparator 408 toggles on each clock cycle from high to low or from low to high.

Control circuit 410 receives as inputs the system clock signal and the output of comparator 408. The output of control circuit 410 provides the latching signal to register circuit 402. I.e., when the output of control circuit 410 goes from low to high, register circuit 402 latches the input values received from shift circuit 406 as output signals. The latching of register circuit 402 has the effect of updating the value of the impedance control signal.

Control circuit 410 interprets and reacts to the sequence of output of comparator 408. The nature of this sequence reflects whether or not the output impedance of bit element circuit 404 is close to the desired impedance. For example, if the output of comparator 408 is switching on every clock edge, then the output resistance of circuit 404 is toggling on every clock edge between being just above and just below that of the external resistor. On the other hand, if the output resistance of circuit 404 is significantly greater (or smaller) than that of the external resistor, then bit elements within bit element circuit 404 are enabled (or disabled) on two or more successive clock cycles. Therefore, the output of comparator 408 is the same for those successive clock cycles.

Figure 6:
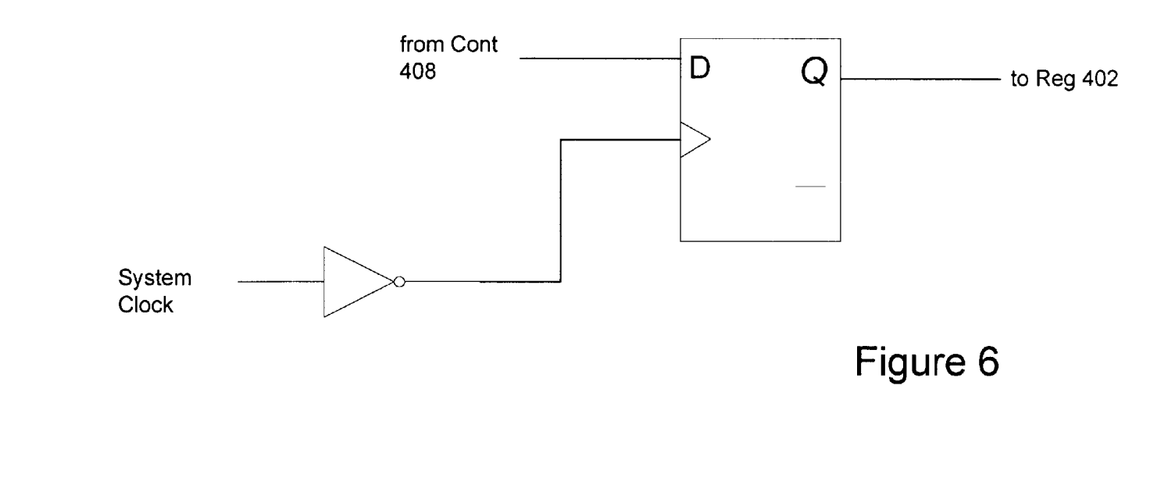
FIG. 6 shows a schematic block diagram of a control circuit of the pull down impedance control circuit of FIG. 4.

Control circuit 410 provides a latch signal with a rising edge, and thereby latches circuit 402, upon receiving the appropriate sequence of values from comparator 408. For example, FIG. 6 shows a control circuit 410 that provides a latch signal with a rising edge after the system clock edge on which the output of comparator 408 goes from low to high. Thus, control circuit 410 provides the latch signal when the output resistance of bit element circuit 404 is just less than that of resistor 122.

Figure 5:
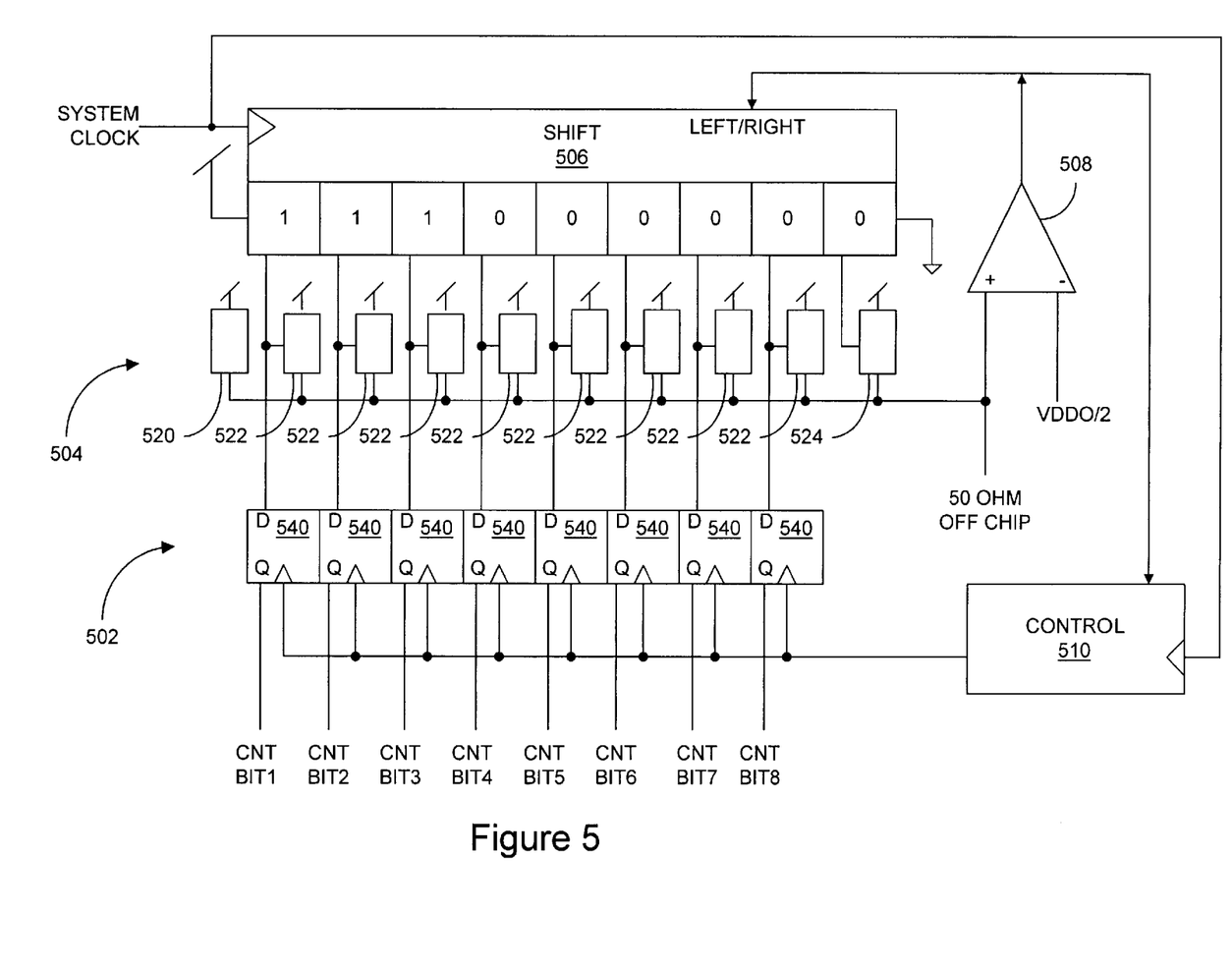
FIG. 5 shows a schematic block diagram of a pull up impedance control circuit of the impedance control circuit of FIG. 3.

Referring to FIG. 5, pull up impedance control circuit 302 includes register circuit 502, bit element circuit 504, shift circuit 506, comparator 508 and control circuit 510. Bit element circuit 504 is coupled between register circuit 502 and shift circuit 506.

Pull up bit element circuit 504 includes ten pull up bit elements that are coupled in parallel between the input to comparator 508 and VDDO. Bit element 520 functions as a base bit element and bit elements 522 function as parallel pull up bit elements. Pull up bit element circuit 504 includes additional bit element 524 which functions as an additional impedance producing bit element.

More specifically, in a preferred embodiment, each pull up element 520, 522, 524 is a PFET transistor as shown in FIG. 7A. Each transistor is coupled in parallel between the input to comparator 508 and VDDO. Transistor 520 functions as a base bit transistor and transistors 522 function as controllable bit transistors. Transistor circuit 504 also includes transistor 524 which functions as an additional impedance generating transistor. The gate of each transistor is coupled to a bit of shift circuit 506 such that the bit controls turning the transistor on and off. The sources of each transistor are coupled to VDDO. Accordingly the transistors of transistor circuit 504 are coupled to mimic the transistors that function as the pull up transistors of driver 110.

Pull up matching circuit 302 functions similarly to that of pull down matching circuit 304 with the exception that the higher resistance value of the straddling resistance values is chosen. As with pull down circuit 304, a "1" enables a bit element and a "0" disables a bit element. Additionally, because the goal of pull up circuit 302 is to obtain a resistance of slightly more than 50 ohms in the slowest corner when all transistors are enabled, an additional bit transistor, i.e., transistor 524, is provided so that transistor circuit 504 may straddle 50 ohms, even when functioning in the slowest PVT corner.

By choosing the lower resistance value for the pull down circuit 304 and the higher resistance value for the pull up circuit 302, impedance matching circuit 112 assures that the voltage swing will be as large as possible while maintaining the desired output resistance.

Figure 7D:
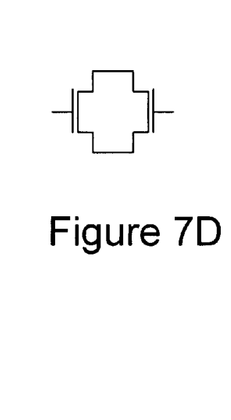

Referring to FIGS. 7A, 7B, 7C and 7D, the pull up and pull down elements of driver circuit 110 as well as within impedance control circuit 112 may be of a variety of configurations. For example, as shown in FIG. 7A, the driver element may be a PMOS transistor. Also for example, as shown in FIG. 7B, the driver element may be the parallel combination of a PMOS transistor and an NMOS transistor. With this parallel combination, it is the resistance of the parallel combination that would be equal to the desired bit element resistance. Also for example, as shown in FIG. 7C, the driver element may be an NMOS transistor. Also for example, as shown in FIG. 7D, the driver element may be the parallel combination of two NMOS transistors. In a preferred embodiment, the pull up driver element includes the parallel combination of the PMOS transistor and the NMOS transistor and the pull down element includes the parallel combination of two NMOS transistors. It will be appreciated that a driver circuit may have other circuitry that contributes to the overall pull up and pull down resistance of the driver.

Referring to FIGS. 4 and 5, the sizing and resistance values of transistors 420 and 422 within pull down bit element circuit 404 and of transistors 520, 522 and 524 within transistor circuit 504 are determined to attain a desired resistance over a possible range of PVT conditions.

More specifically, when determining the sizing and resistance values of the transistors, the fastest and slowest PVT corners are first determined. Then in the fastest (i.e., the lowest impedance) PVT corner, the value of the width of the channel of the base bit $W_B$ functioning alone is determined which provides the desired output impedance.

After the value of the width of the channel of the base bit functioning alone is determined, then in the slowest (i.e., the highest impedance) PVT corner, the value of the total width required to provide this impedance (i.e., $W_B+W_{sN}$) is determined. This total width is equal to the sum of the base bit width and the widths of all bit element transistors being enabled.

For a given PVT corner, the resistance and widths of the transistors are related as follows.

$$\frac{R_{BN}}{R_B} = \frac{W_B}{W_B + W_{sN}}$$

Where,

N is the number of supplemental bits;

$R_B$ is the resistance of base bit transistor 420;

$R_{Bn}$ is the resistance of the parallel combination of the base bit transistor and supplemental bits 1 through n;

$R_{BN}$ is the resistance of the parallel combination of the base bit transistor and all of the supplemental bit transistors $W_B$ is the width of the channel of the base bit, $W_B$ is also equal to the width necessary to give a desired $R_B$ in the fastest corner;

$W_n$ is the width of each additional bit transistor n; and.

$W_{sN}$ is the sum of the widths of the supplemental bits 1 through N. I.e., $$W_{sN} = \sum_{n=1}^{N} W_n$$

$W_B+W_{sN}$ is equal to the net width necessary to give a desired resistanct $R_{BN}$ in the slowest PVT corner.

Once $W_B$ and $W_B+W_{sN}$ are known, then either (a) the change in net resistance as a fraction of the initial resistance due to the addition of one supplemental bit or (b) the total number of supplemental bits may be derived if the other value is known. More specifically, if the total number of supplemental bits is known then the change in net resistance is derived as follows.

$$D = -1 + \left(\frac{W_B}{W_B + W_{sN}}\right)^{\frac{1}{N}} = -1 + \exp\left(\frac{1}{N} \ln \frac{W_B}{W_B + W_{sN}}\right)$$

Where

D is the change in resistance due to the enabling of an additional bit transistor (transistor n+1) as a fraction of $R_{Bn}$. D is a desired constant such as, for example, −0.10 or −0.05 (note that D is negative). Additionally, D is defined as follows $$D \equiv \frac{R_{B(n+1)} - R_{Bn}}{R_{Bn}}$$

If the change in net resistance as a fraction of the initial resistance due to the addition of one supplemental bit is known, then the total number of supplemental bits is derived as follows.

$$N = \frac{\ln\left(\frac{W_B}{W_B + W_{sN}}\right)}{\ln(1 + D)}$$

The width of each supplemental bit is now determined. More specifically, $$W_n = -DW_B(1+D)^{-n}$$

Other Embodiments

Other embodiments are within the following claims.

For example, while the described embodiment is shown for controlling drivers that have 8 controllable bit transistors, it will be appreciated that any number of controllable bit transistors may be provided. Additionally, while the described embodiment sets forth an 8-bit wide control signal, it will be appreciated that any width control signal may be provided. Note that because the base bit of the driver circuit is always enabled, the control signal need only be as wide as one bit less than the number of controllable bits within the driver circuit. Providing the driver circuit and the impedance control circuit with more bits allows finer precision for approaching the desired impedance. Providing fewer bits allows fewer traces within component 102 to each driver 110.

Also for example, while the described embodiment is provided for a transmission line having an impedance of 50 ohms, the invention also functions for transmission lines having other impedance values by adjusting the value of precision resistors 310 as well as the sizes of the transistors to account for the different transmission line impedance. Also for example, by adjusting the value of the reference resistor and the reference voltage, other internal impedances and other output voltage matches may be detected.

Also for example, while the change in net resistance with the enabling or disabling of an additional bit element is 7 percent, it will be appreciated that other changes in net resistance are within the scope of the invention.

Also for example, while a variety of configurations are disclosed for the pull up and pull down driver elements, it will be appreciated that other driver configurations may be used so long as the appropriate driver and termination resistances are maintained.

Also for example, while preferred embodiment discloses chosing the lower resistance value for the pull down circuit and the higher resistance value for the pull up circuit, other combinations are also possible. For example, the higher resistance for both the pull up and pull down circuits, the lower resistance value for both the pull up and pull down circuits or the higher resistance for the pull down circuit and the lower resistance for the pull up circuit.

Also, in the present invention, a MOS transistor may be conceptualized as having a control terminal which controls the flow of current between a first current handling terminal and a second current handling terminal. Although MOS transistors are frequently discussed as having a drain, a gate, and a source, in most such devices the drain is interchangeable with the source. This is because the layout and semiconductor processing of the transistor is symmetrical (which is typically not the case for bipolar transistors). For an N-channel MOS transistor, the current handling terminal normally residing at the higher voltage is customarily called the drain. The current handling terminal normally residing at the lower voltage is customarily called the source. A sufficient voltage on the gate causes a current to therefore flow from the drain to the source. The gate to source voltage referred to in an N-channel MOS device equations merely refers to whichever diffusion (drain or source) has the lower voltage at any given time. For example, the "source" of an N-channel device of a bi-directional CMOS transfer gate depends on which side of the transfer gate is at a lower voltage. To reflect the symmetry of most N channel MOS transistors, the control terminal is the gate, the first current handling terminal may be termed the "drain/source", and the second current handling terminal may be termed the "source/drain". Such a description is equally valid for a P channel MOS transistor, since the polarity between drain and source voltages, and the direction of current flow between drain and source, is not implied by such terminology. Alternatively, one current handling terminal may be arbitrarily deemed the "drain" and the other deemed the "source", with an implicit understanding that the two are not distinct, but interchangeable.

What is claimed is:

1. A method for determining bit element values of a base bit element and a plurality of controllable bit elements having an impedance range from a lowest impedance to a highest impedance based upon bit element characteristics, the base bit element and the plurality of controllable bit elements being within an impedance control circuit, the method comprising determining a desired stepped impedance value for providing a desired impedance resolution;

determining a value of a width of a base bit element functioning alone when the base bit element is functioning at the lowest impedance;

determining the value of a total width of a plurality of bit elements functioning together when the bit elements are fuctioning at the highest impedance;

subtracting the value of the width of the base bit element from the total width to provide a sum width;

determining a number of controllable bit elements required to provide the stepped impedance range based upon the width of base bit element, the sum width and the desired stepped impedance within the impedance range; and, configuring the base bit element and the plurality of controllable bit elements of the impedance control circuit according to bit element values so determined.

2. The method for determining bit element values of claim 1 wherein the plurality of controllable bit elements are controlled by a control signal.

3. The method for determining bit element values of claim 2 wherein the control signal is an n-bit wide control signal, where n corresponds to the number of controllable bit elements.

4. The method for determining bit element values of claim 1 wherein the number of controllable bit elements is eight.

5. The method for determining bit element values of claim 1 wherein the desired stepped impedance value equals the resistance of a controllable bit element minus the resistance of the base bit element, the difference of which is divided by the resistance of the base bit element.

6. The method for determining bit element values of claim 1 wherein the bit element characteristics include process, voltage and temperature characteristics.

7. The method for determining bit element values of claim 1 wherein the impedance control circuit is a pull up impedance control circuit.

8. The method for determining bit element values of claim 7 wherein the bit element values are designed to provide an impedance of slightly more than 50 ohms when only the base bit element is enabled and the bit element characteristics correspond to the lowest impedance and substantially 50 ohms when the base bit element and all of the controllable bit elements are enabled and the bit element characteristics correspond to the highest impedance.

9. The method for determining bit element values of claim 7 wherein the bit element values are designed to provide an impedance of slightly less than 50 ohms when only the base bit element is enabled and the bit element characteristics correspond to the lowest impedance and substantially 50 ohms when the base bit element and all of the controlled bit elements are enabled and the bit element characteristics correspond to the highest impedance.

10. The method for determining bit elements values of claim 1 wherein the impedance control circuit is a pull down impedance control circuit.

11. The method for determining bit element values of claim 1 wherein the bit element characteristics include process characteristics.

12. The method for determining bit element values of claim 1 wherein the bit element characteristics include voltage characteristics.

13. The method for determining bit element values of claim 1 wherein the bit element characteristics include temperature characteristics.

* * * * *